(12) United States Patent
Lin et al.

(10) Patent No.: US 7,888,195 B2
(45) Date of Patent: Feb. 15, 2011

(54) METAL GATE TRANSISTOR AND METHOD FOR FABRICATING THE SAME

(75) Inventors: Chien-Ting Lin, Hsin-Chu (TW); Li-Wei Cheng, Hsin-Chu (TW); Jung-Tsung Tseng, Tainan (TW); Che-Hua Hsu, Hsin-Chu Hsien (TW); Chih-Hao Yu, Tainan County (TW); Tian-Fu Chiang, Taipei (TW); Yi-Wen Chen, Tainan County (TW); Chien-Ming Lai, Tainan County (TW); Cheng-Hsien Chou, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/198,128

(22) Filed: Aug. 26, 2008

(65) Prior Publication Data
US 2010/0052074 A1 Mar. 4, 2010

(51) Int. Cl.
*H01L 21/8238* (2006.01)
(52) U.S. Cl. .............. 438/199; 438/183; 438/188; 438/272; 438/926
(58) Field of Classification Search .......... 438/183, 438/188, 199, 270, 272, 926, FOR. 187, FOR. 216; 257/69, 204, E21.444, E21.453, E27.046, 257/E27.108, E21.632
See application file for complete search history.

(56) References Cited

U.S. PATENT DOCUMENTS

| | | | | |
|---|---|---|---|---|
| 2004/0159903 A1* | 8/2004 | Burgener et al. | ............ | 257/432 |
| 2004/0173886 A1* | 9/2004 | Carley | ............ | 257/678 |
| 2005/0263829 A1* | 12/2005 | Song et al. | ............ | 257/379 |
| 2006/0065939 A1* | 3/2006 | Doczy et al. | ............ | 257/412 |
| 2006/0134433 A1* | 6/2006 | Maula et al. | ............ | 428/411.1 |
| 2009/0017563 A1* | 1/2009 | Jiang et al. | ............ | 438/4 |

* cited by examiner

*Primary Examiner*—N Drew Richards
*Assistant Examiner*—Joannie A Garcia
(74) *Attorney, Agent, or Firm*—Winston Hsu; Scott Margo

(57) ABSTRACT

A method for fabricating a transistor having metal gate is disclosed. First, a substrate is provided, in which the substrate includes a first transistor region and a second transistor region. A plurality of dummy gates is formed on the substrate, and a dielectric layer is deposited on the dummy gate. The dummy gates are removed to form a plurality of openings in the dielectric layer. A high-k dielectric layer is formed to cover the surface of the dielectric layer and the opening, and a cap layer is formed on the high-k dielectric layer thereafter. The cap layer disposed in the second transistor region is removed, and a metal layer is deposited on the cap layer of the first transistor region and the high-k dielectric layer of the second transistor region. A conductive layer is formed to fill the openings of the first transistor region and the second transistor region.

11 Claims, 5 Drawing Sheets

METAL GATE TRANSISTOR AND METHOD FOR FABRICATING THE SAME

BACKGROUND OF THE INVENTION

1. Field of the Invention

The invention relates to a method for fabricating a transistor, and more particularly, to a method for fabricating a metal gate transistor.

2. Description of the Prior Art

In the field of semiconductor fabrication, the use of polysilicon material is diverse. Having a strong resistance for heat, polysilicon materials are commonly used to fabricate gate electrodes for metal-oxide semiconductor transistors. The gate pattern fabricated by polysilicon materials is also used to form self-aligned source/drain regions as polysilicon readily blocks ions from entering the channel region.

However, devices fabricated by polysilicon still have many drawbacks. In contrast to most metal, polysilicon gates are fabricated by semiconductor materials having high resistance, which causes the polysilicon gate to work under a much lower rate than other metal gates. In order to compensate for slightly lowered rate of performance, a significant amount of silicides is applied during the fabrication of polysilicon processes, such that the performance of the device could be increased to an acceptable level.

Gate electrodes fabricated by polysilicon also causes a depletion effect. In most circumstances, the optimum doping concentration for polysilicon is between about $2 \times 20^{20}/cm^3$ and $3 \times 10^{20}/cm^3$. As most gate electrodes have a doping concentration of at least $5 \times 10^{21}/cm^3$, the limited doping concentration of polysilicon gates often results in a depletion region at the interface between the gate and the gate dielectric layer. This depletion region not only thickens the gate dielectric layer, but also lowers the capacitance of the gate, and ultimately reduces the driving ability of the device. In order to solve this problem, double work function metal gates are used to replace conventional polysilicon to fabricate gate electrodes for MOS transistors.

However, it is well known in the art that the degree of difficulty for fabricating a well-controlled double work function metal is immense as the process often involves complicated integration between NMOS device and PMOS device. The difficulty increases even more as the thickness and materials used in double work function metal gates requires a much more strict demand. Hence, how to successfully fabricate double work function metal gate transistors with lower cost and improved performance has become an important task in this field.

SUMMARY OF THE INVENTION

It is an objective of the present invention to provide a method for fabricating a metal gate transistor.

According to a preferred embodiment of the present invention, the method for fabricating metal gate transistor includes the steps of: providing a substrate having a first transistor region and a second transistor region; forming a plurality of dummy gates on the substrate and within the first transistor region and the second transistor region; forming a source/drain region at two sides of each dummy gate; forming a dielectric layer to cover the dummy gates; removing the dummy gates to form a plurality of openings in the dielectric layer of the first transistor region and the second transistor region; forming a high-k dielectric layer to cover the dielectric layer and surface of each opening; depositing a first cap layer on the high-k dielectric layer; removing the first cap layer disposed in the second transistor region; forming a metal layer on the first cap layer of the first transistor region and the high-k dielectric layer of the second transistor region; forming a conductive layer to fill the openings of the first transistor region and the second transistor region.

Another aspect of the present invention provides a metal gate transistor. The metal gate transistor preferably includes: a substrate, a metal gate disposed on the substrate, and a source/drain region disposed in the substrate with respect to two sides of the metal gate. The metal gate includes a U-shaped high-k dielectric layer, a U-shaped cap layer disposed over the surface of the U-shaped high-k dielectric layer, and a U-shaped metal layer disposed over the U-shaped cap layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
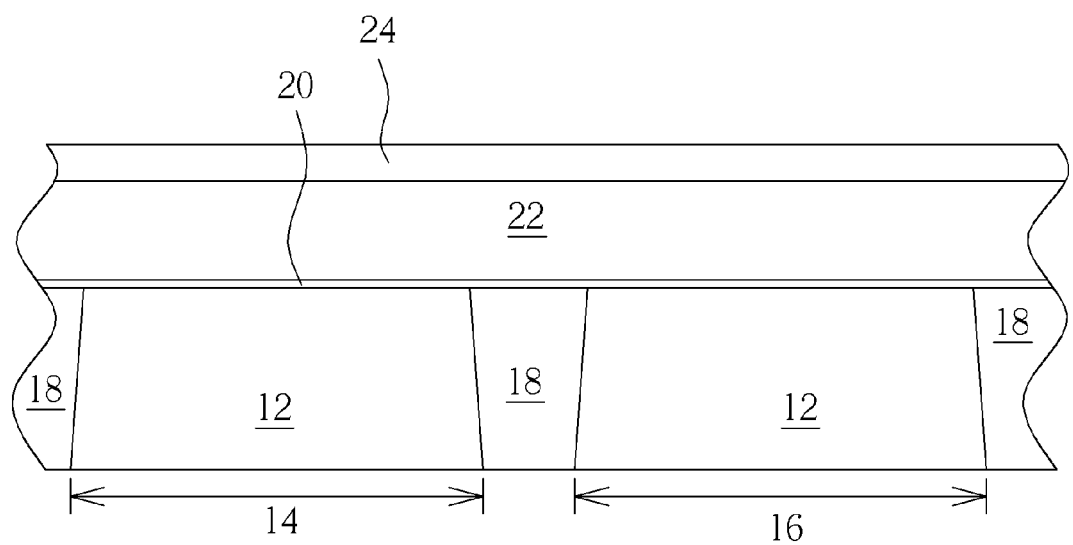
FIGS. 1-8 illustrate a method for fabricating a metal gate transistor according to a preferred embodiment of the present invention.

Referring to FIGS. 1-8, FIGS. 1-8 illustrate a method for fabricating a metal gate transistor according to a preferred embodiment of the present invention. As shown in FIG. 1, a substrate 12, such as a silicon substrate or a silicon-on-insulator substrate is provided. At least a NMOS transistor region 14 and a PMOS transistor region 16 are defined in the substrate 12 and a plurality of shallow trench isolations 18 is formed to isolate the transistor regions 14 and 16.

A gate insulating layer 20 composed of dielectric material such as oxides or nitrides is then formed on the surface of the substrate 12. The gate insulating layer 20 could also be composed of pad oxide or a high-k dielectric layer composed of HfSiO, HfSiON, $HfO_2$, $La_2O_3$, LaAlO, $ZrO_2$, ZrSiO, or HfZrO, and the cap layer 56 comprises $La_2O_3$, MgO, $Dy_2O_3$, or other lanthanide oxides. A polysilicon layer 22 serving as a dummy gate layer is deposited on the gate insulating layer 20, and a hard mask 24 is disposed on the polysilicon layer 22, in which the polysilicon layer 22 includes a depth of approximately 1000 angstroms. In this embodiment, the hard mask 24 is composed of silicon oxide, silicon nitride, or silicon oxynitride, and the polysilicon layer 22 is composed of undoped polysilicon or polysilicon having n+ dopants therein, which are all within the scope of the present invention.

Figure 2:
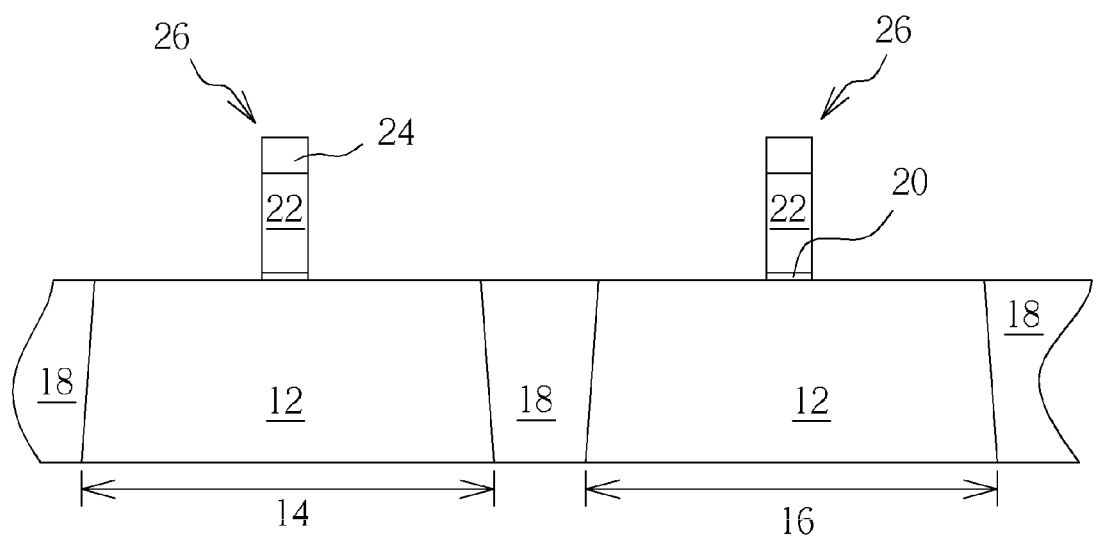

As shown in FIG. 2, a patterned photoresist (not shown) is formed on the polysilicon layer 22, and a pattern transfer process is performed by using the patterned photoresist as mask to remove a portion of the hard mask 24, the polysilicon layer 22 and the gate insulating layer 20 through one or a plurality of etching processes. After stripping the patterned photoresist, a plurality of dummy gates, such as the polysilicon gates 26 shown in this embodiment is formed in the NMOS transistor region 14 and the PMOS transistor region 16.

Figure 3:
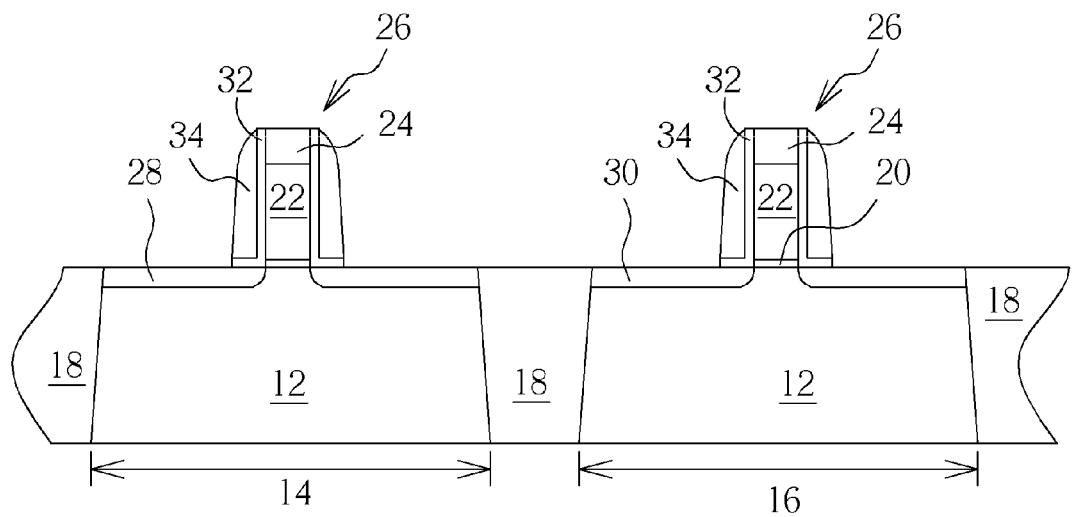

As shown in FIG. 3, a light doping process is conducted in the NMOS transistor region 14 and the PMOS transistor region 16 to form a plurality of lightly doped drains. For instance, a patterned photoresist (not shown) can be disposed on regions outside the NMOS transistor region 14, and an ion implantation is conducted by using the patterned photoresist as mask to implant n-type dopants into the substrate 12 at two sides of the polysilicon gate 26 of the NMOS transistor region 14 to form a lightly doped drain 28. After removing the aforementioned photoresist, another patterned photoresist is disposed on regions outside the PMOS transistor region 16, and another ion implantation is conducted by using this patterned photoresist as mask to implant p-type dopants into the substrate 12 at two sides of the polysilicon gate 26 of the PMOS transistor region 16 for forming a lightly doped drain 30.

A first stage of spacer formation is conducted thereafter. For instance, a silicon oxide layer 32 is formed by oxidizing the sidewall surface of the polysilicon gate 26, and a spacer 34 composed of silicon nitride is formed on the sidewall of the polysilicon gates 26 of the NMOS transistor region 14 and the PMOS transistor region 16.

Figure 4:
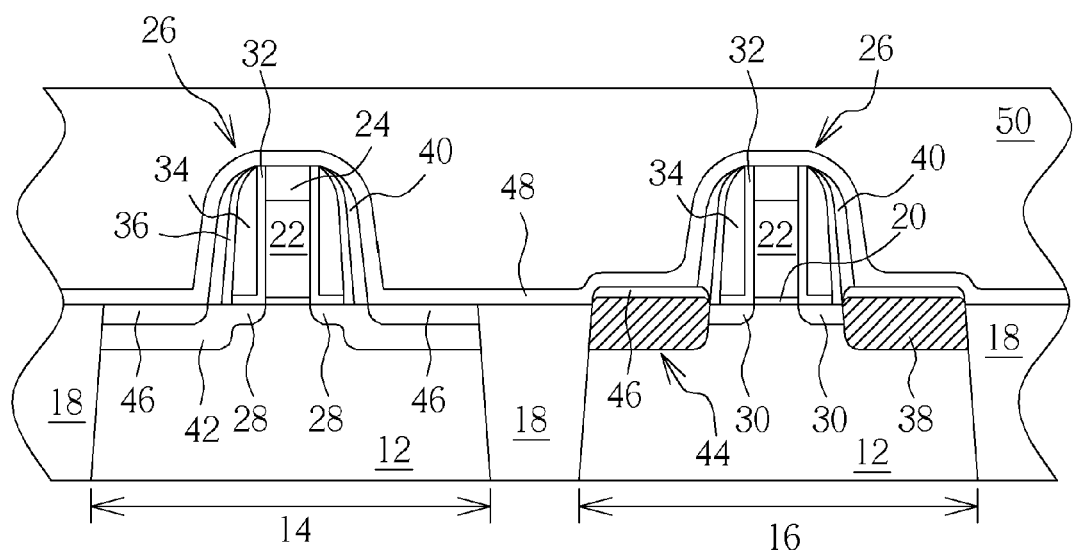

As shown in FIG. 4, a passivation layer 36 composed of silicon nitride is deposited over the surface of the spacer 34, and a selective epitaxial growth process is conducted to grow a strained silicon in the substrate 12 of the two transistor regions 14, 16. For instance, two recesses could be formed in the substrate 12 at two sides of the polysilicon gate 26 of the PMOS transistor region 16, and an epitaxial layer 38 composed of silicon germanium is epitaxially grown to substantially fill the two recesses. The epitaxial layer 38 preferably provides a compressive strain to the channel region of the PMOS transistor region 16, thereby increasing the hole mobility of the PMOS transistor.

Next, a second stage of the spacer formation is performed to form a spacer 40 composed of silicon oxide on the sidewall of the passivation layer 36 of the NMOS transistor region 14 and the PMOS transistor region 16.

A heavy doping process is then conducted to form a plurality of source/drain regions in the NMOS transistor region 14. Similar to the aforementioned light doping process, a patterned photoresist (not shown) can be disposed on regions outside the NMOS transistor region 14, and an ion implantation is conducted by using this patterned photoresist as mask to implant n-type dopants into the substrate 12 at two sides of the spacer 40 of the NMOS transistor region 14 to form a source/drain region 42. After stripping the patterned photoresist, a source/drain region 44 for the PMOS transistor region 16 could also be fabricated with a similar manner as the source/drain region 42 of the NMOS transistor region 14. For instance, the source/drain region 44 is preferably formed by an in-situ doping performed with the selective epitaxial growth process shown FIG. 4, in which the undoped selective epitaxial growth is preferably performed before the in-situ doping process.

After the source/drain regions 42 and 44 are formed, a salicide process is performed by first depositing a metal layer (not shown) composed of cobalt, titanium, nickel, platinum, palladium, or molybdenum over the surface of the substrate 12 and the spacer 40, and a rapid thermal annealing process is conducted thereafter to form a silicide 46 at two sides of the spacer 40. The un-reacted metal layer is removed thereafter.

Next, a silicon nitride layer 48 is deposited on each polysilicon gate 26, the spacer 40, and the substrate 12. In this embodiment, the silicon nitride layer 48, primarily serving as an etch stop layer in the later planarizing process, preferably includes a depth of approximately 100 angstroms. An interlayer dielectric layer 50 composed of oxides is then deposited on the silicon nitride layer 48 of both NMOS transistor region 14 and PMOS transistor region 16.

Figure 5:
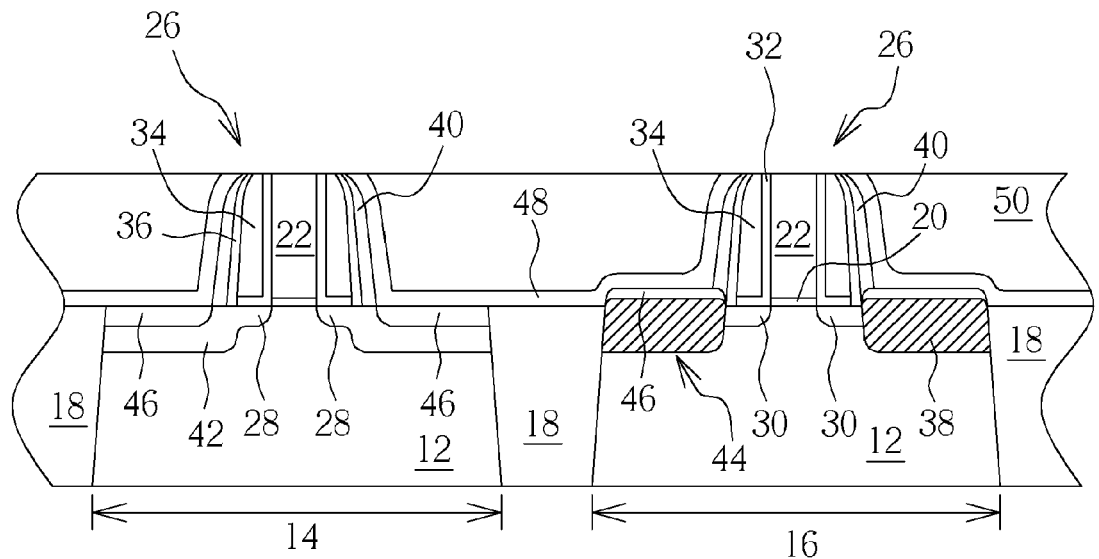

As shown in FIG. 5, a chemical mechanical polishing process or a dry etching process is performed to remove a portion of the interlayer dielectric layer 50, the silicon nitride layer 48, and the hard mask 24 until reaching the surface of the polysilicon gate 26, such that the top of the polysilicon gate 26 is substantially even to the surface of the interlayer dielectric layer 50.

Figure 6:
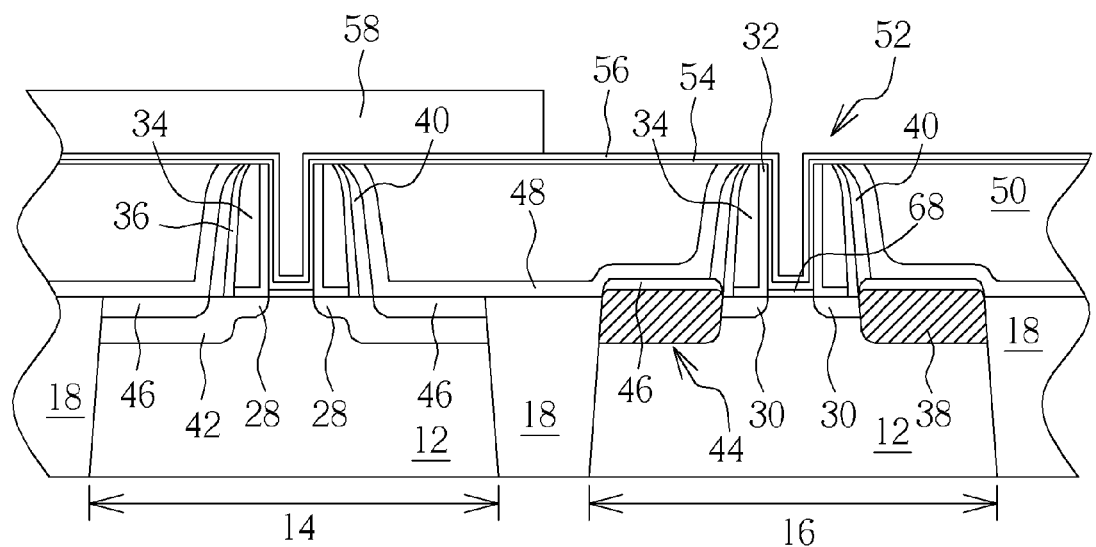

As shown in FIG. 6, a selective etching process is conducted by using etchant such as ammonium hydroxide ($NH_4OH$) or tetramethylammonium hydroxide (TMAH) to remove the polysilicon gate 26 disposed in the NMOS transistor region 14 and the PMOS transistor region 16 without damaging the interlayer dielectric layer 50. In this embodiment, the etching process preferably removes the polysilicon gate 26 and forms an opening 52 in each transistor region 14, 16 for exposing the gate insulating layer 20 underneath.

If the gate insulating layer 20 is composed of common dielectric material, the gate insulating layer 20 is preferably removed to expose the substrate 12 underneath, and a pad oxide 68, a high-k dielectric layer 54 and a cap layer 56 are sequentially deposited over the surface of the interlayer dielectric layer 50 of the two transistor regions 14, 16 and the sidewall and bottom of the openings 52. Preferably, the high-k dielectric layer 54 comprises HfSiO, HfSiON, $HfO_2$, $La_2O_3$, LaAlO, $ZrO_2$, ZrSiO, or HfZrO, and the cap layer 56 comprises $La_2O_3$, MgO, $Dy_2O_3$, or other lanthanide oxides.

If the gate insulating layer 20 is composed of high-k dielectric material, the cap layer 56 is deposited directly on the interlayer dielectric layer 50 of the NMOS transistor region 14 and the PMOS transistor region 16, as well as the sidewall and bottom of the opening 52.

A patterned photoresist 58 is then disposed on the NMOS transistor region 14, and an etching process is carried out by using the patterned photoresist 58 as a mask to remove the cap layer 56 in the PMOS transistor region 16.

Figure 7:
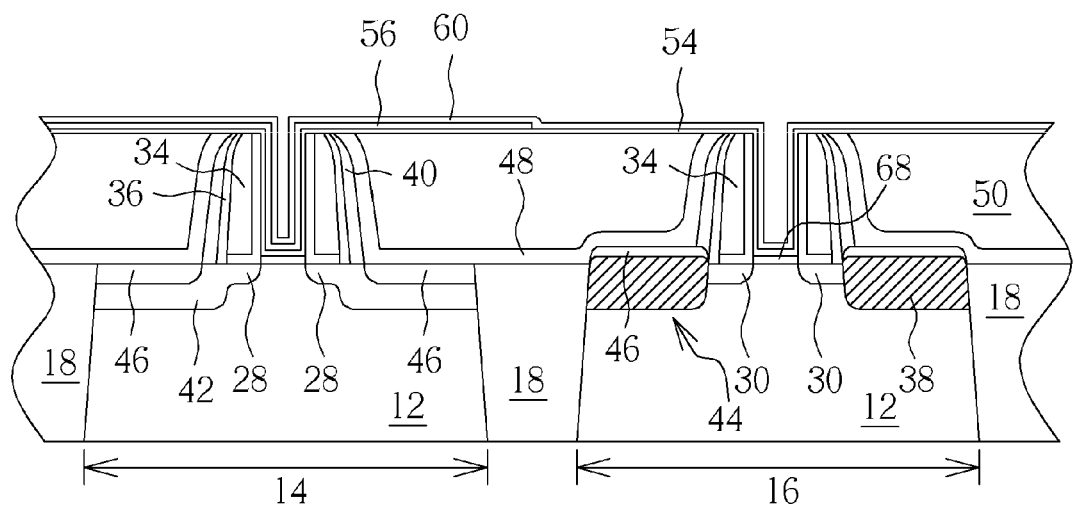

As shown in FIG. 7, after stripping the patterned photoresist 58, a metal layer 60 is deposited on the cap layer 56 of the NMOS transistor region 14 and the high-k dielectric layer 54 of the PMOS transistor region 16. The metal layer 60 is preferably composed of TiN, TaC, Ta, TaSiN, Al, or TiAlN.

It should be noted that the present invention specifically uses the cap layer 56 to define the work function of the metal layer 60, thereby forming metals with Quasi Fermi level close to that of the N-type silicon or P-type silicon and increasing the performance of the CMOS transistor. In the aforementioned embodiment, a cap layer 56 composed of $La_2O_3$ is deposited before the formation of the metal layer 60 to define the work function of n-type metal.

In addition to the above process, a cap layer (not shown) could also be deposited between the high-k dielectric layer 54 and the metal layer 60 of the PMOS transistor region 16 to define the work function of the p-type metal. For instance, after removing the cap layer 56 disposed in the PMOS transistor region 16, a cap layer composed of $Al_2O_3$, AlN, or AlON could be formed on the high-k dielectric layer 54 of the PMOS transistor region 16, and the metal layer 60 is covered on the newly deposited cap layer thereafter, which are all within the scope of the present invention.

Figure 8:
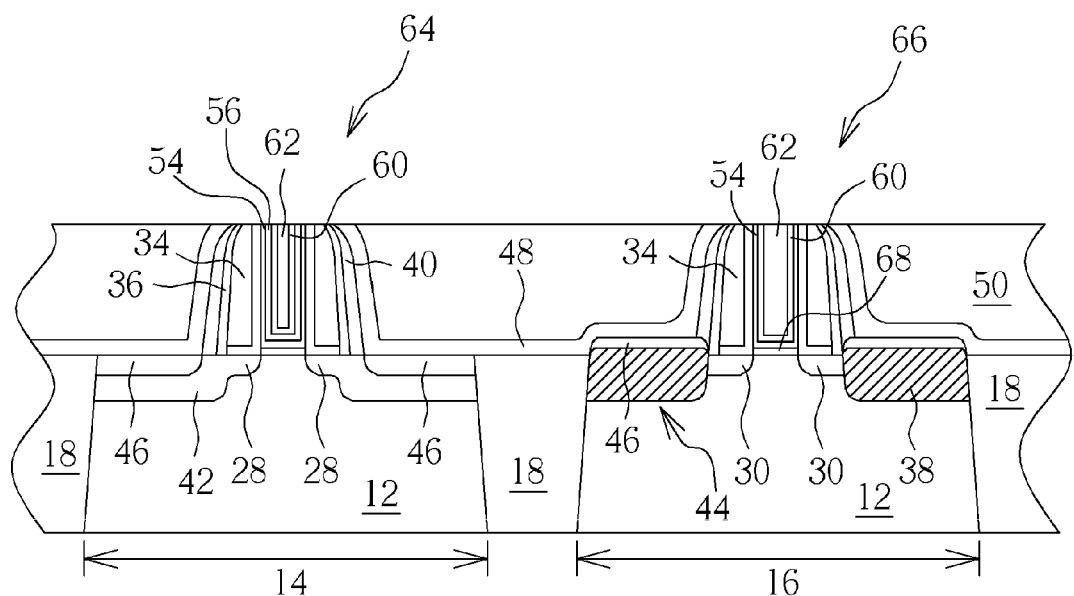

As shown in FIG. 8, when the openings 52 are unfilled to the full, a conductive layer 62 composed of low resistance material is selectively deposited on the metal layer 60 of the NMOS transistor region 14 and the PMOS transistor region 16 to fill the openings 52. The conductive layer 62 is preferably composed of Al, W, TiAl or CoWP. Another chemical mechanical polishing process is performed thereafter to remove a portion of the conductive layer 62 and the metal layer 60 for forming a CMOS transistor with metal gates 64 and 66.

Referring to FIG. 8 again, which illustrates a schematic view of a CMOS transistor with metal gates 64, 66 fabricated by the aforementioned process. The CMOS transistor includes a substrate 12, two metal gates 64, 66 disposed on the substrate 12 of the NMOS transistor region 14 and the PMOS transistor region 16, and two source/drain regions 42, 44 formed in the substrate 12 with respect to two sides of the metal gates 64, 66. The metal gate 64 of the NMOS transistor region 14 includes a pad oxide 68 disposed on the bottom of the metal gate 64, a U-shaped high-k dielectric layer 54 disposed on the pad oxide 68 and covering the sidewall of the metal gate 64, a U-shaped cap layer 56 disposed on the U-shaped high-k dielectric layer 54, a U-shaped metal layer 60 disposed on the U-shaped cap layer 56, and a substantially I-shaped conductive layer 62 filling the remaining opening of the metal gate 64.

The metal gate 66 disposed in the PMOS transistor region 16 on the other hand includes a pad oxide 68 disposed on the bottom of the metal gate 66, a U-shaped high-k dielectric layer 54 disposed on the pad oxide 68 and covering the sidewall of the metal gate 66, a U-shaped metal layer 60 disposed on the U-shaped high-k dielectric layer 54, and a substantially I-shaped conductive layer 62 disposed on the U-shaped metal layer 60 to fill the remaining opening of the metal gate 66. According to the embodiment illustrated in FIG. 8, no cap layer is disposed in the PMOS transistor region 16. However, as mentioned above, a U-shaped cap layer could also be disposed between the high-k dielectric layer 54 and the U-shaped metal layer 60 of the PMOS transistor region 16 to define the work function of the p-type metal, which is also within the scope of the present invention.

Figure 9:
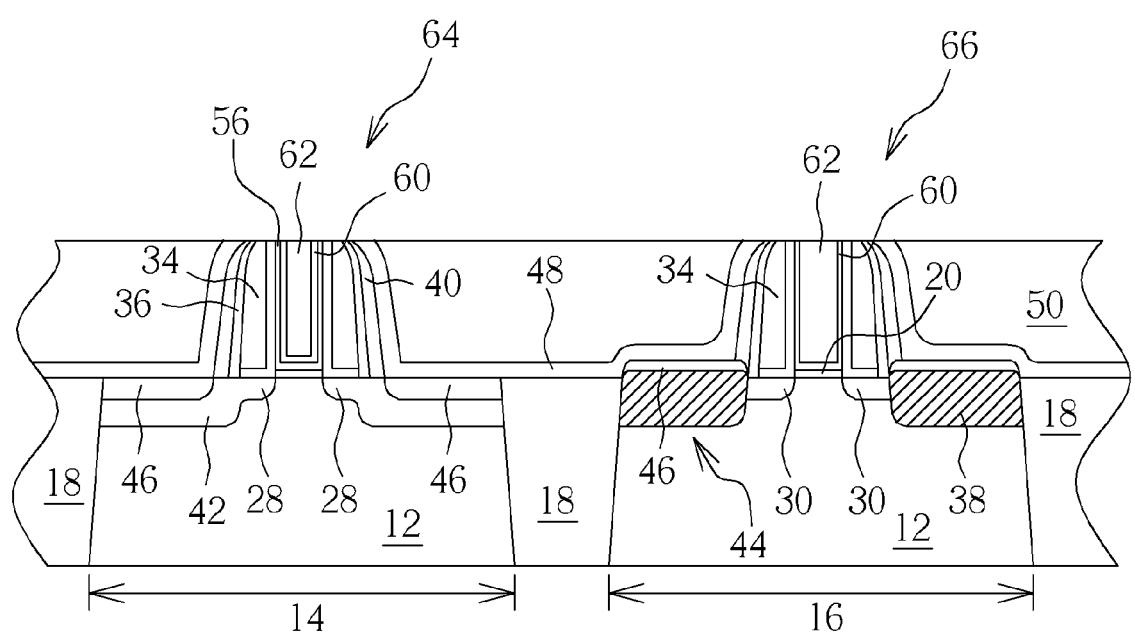
FIG. 9 illustrates a metal gate transistor according to an embodiment of the present invention.

According to an embodiment of the present invention, as the cap layer 56 could be deposited directly on the interlayer dielectric layer 50 of the NMOS transistor region 14 and the PMOS transistor region 16 as well as the sidewall and bottom of the opening 52 while the gate insulating layer 20 is composed of high-k dielectric material, a CMOS transistor shown in FIG. 9 is fabricated. As shown in FIG. 9, the CMOS transistor includes a substrate 12, two metal gates 64, 66 disposed on the substrate 12 of the NMOS transistor region 14 and the PMOS transistor region 16, and two source/drain regions 42, 44 formed in the substrate 12 with respect to two sides of the metal gates 64, 66. The metal gate 64 of the NMOS transistor region 14 includes a gate insulating layer 20 disposed on the bottom of the metal gate 64, a U-shaped cap layer 56 disposed on the gate insulating layer 20 and covering the sidewall of the metal gate 64, a U-shaped metal layer 60 disposed on the U-shaped cap layer 56, and a conductive layer 62 filling the remaining opening of the metal gate 64.

The metal gate 66 disposed in the PMOS transistor region 16 on the other hand includes a gate insulating layer 20 disposed on the bottom of the metal gate 66, a U-shaped metal layer 60 disposed on the gate insulating layer 20 and covering the sidewall of the metal gate 66, and a conductive layer 62 disposed on the U-shaped metal layer 60 to fill the remaining opening of the metal gate 66. As shown in FIG. 9, no cap layer is disposed in the PMOS transistor region 16. However, as mentioned above, a U-shaped cap layer could also be disposed between the gate insulating layer 20 and the U-shaped metal layer 60 of the PMOS transistor region 16 to define the work function of the p-type metal, which is also within the scope of the present invention.

Those skilled in the art will readily observe that numerous modifications and alterations of the device and method may be made while retaining the teachings of the invention.

What is claimed is:

1. A method for fabricating metal gate transistor, comprising:
   providing a substrate having a first transistor region and a second transistor region;
   forming a plurality of dummy gates on the substrate and within the first transistor region and the second transistor region;
   forming a source/drain region at two sides of each dummy gate;
   forming a dielectric layer to cover the dummy gates;
   removing the dummy gates to form a plurality of openings in the dielectric layer of the first transistor region and the second transistor region;
   forming a high-k dielectric layer to cover the dielectric layer and surface of each opening;
   depositing a first cap layer on the high-k dielectric layer;
   removing the first cap layer disposed in the second transistor region; and
   forming a metal layer on the first cap layer of the first transistor region and the high-k dielectric layer of the second transistor region.

2. The method of claim 1, wherein the first transistor region is a NMOS transistor region.

3. The method of claim 2, wherein the first cap layer comprises LaO, MgO, $Dy_2O_3$, or other lanthanide oxides.

4. The method of claim 1, wherein the second transistor region is a PMOS transistor region.

5. The method of claim 4, further comprising forming a second cap layer in the second transistor region after removing the first cap layer from the second transistor region.

6. The method of claim 5, wherein the second cap layer comprises $Al_2O_3$, AlN, or AlON.

7. The method of claim 1, wherein the metal layer comprises TiN, TaC, Ta, TaSiN, Al, or TiAlN.

8. The method of claim 1, further comprising performing a first chemical mechanical polishing process after forming the dielectric layer and before removing the dummy gate.

9. The method of claim 1, further comprising:
   forming a conductive layer to fill the openings of the first transistor region and the second transistor region after forming the metal layer on the first cap layer of the first transistor region and the high-k dielectric layer of the second transistor region; and
   performing a second chemical polishing after forming the conductive layer.

10. The method of claim 1, wherein the high-k dielectric layer comprises HfSiO, HfSiON, HfO, LaO, LaAlO, ZrO, ZrSiO, or HfZrO.

11. The method of claim 9, wherein the conductive layer comprises Al, W, TiAl or CoWP.

* * * * *